(12) United States Patent
Mikhael et al.

(10) Patent No.: US 7,300,859 B2
(45) Date of Patent: *Nov. 27, 2007

(54) ATMOSPHERIC GLOW DISCHARGE WITH CONCURRENT COATING DEPOSITION

(75) Inventors: Michael G. Mikhael, Tucson, AZ (US); Angelo Yializis, Tucson, AZ (US); Richard E. Ellwanger, Tucson, AZ (US)

(73) Assignee: Sigma Laboratories of Arizona, LLC, Tucson, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/448,966

(22) Filed: Jun. 7, 2006

(65) Prior Publication Data

US 2006/0240648 A1 Oct. 26, 2006

Related U.S. Application Data

(63) Continuation-in-part of application No. 10/883,167, filed on Jul. 1, 2004, now Pat. No. 7,067,405, which is a continuation-in-part of application No. 10/228,358, filed on Aug. 26, 2002, now Pat. No. 6,774,018, which is a continuation-in-part of application No. 09/660,003, filed on Sep. 12, 2000, now Pat. No. 6,441,553, which is a continuation-in-part of application No. 09/241,882, filed on Feb. 1, 1999, now Pat. No. 6,118,218.

(51) Int. Cl.
*H01L 21/20* (2006.01)

(52) U.S. Cl. .................. 438/503; 438/507; 438/679; 438/680; 438/681

(58) Field of Classification Search .................. None
See application file for complete search history.

(56) References Cited

U.S. PATENT DOCUMENTS

| 5,968,377 | A | 10/1999 | Yuasa et al. |
| 6,060,453 | A | 5/2000 | Thomson et al. |
| 6,774,018 | B2 * | 8/2004 | Mikhael et al. ............. 438/485 |
| 7,067,405 | B2 * | 6/2006 | Mikhael et al. ............. 438/503 |

* cited by examiner

*Primary Examiner*—Wai-Sing Louie
(74) *Attorney, Agent, or Firm*—Antonio R. Durando (57) ABSTRACT

A plasma is produced in a treatment space (58) by diffusing a plasma gas at atmospheric pressure and subjecting it to an electric field created by two metallic electrodes (54,56) separated by a dielectric material (64), a precursor material is introduced into the treatment space to coat a substrate film or web (14) by vapor deposition or atomized spraying at atmospheric pressure. The deposited precursor is cured by electron-beam, infrared-light, visible-light, or ultraviolet-light radiation, as most appropriate for the particular material being deposited. Additional plasma post-treatment may be used to enhance the properties of the resulting coated products.

28 Claims, 9 Drawing Sheets

ATMOSPHERIC GLOW DISCHARGE WITH CONCURRENT COATING DEPOSITION

RELATED APPLICATIONS

This application is a continuation-in-part of U.S. Ser. No. 10/883,167, filed on Jul. 1, 2004, which is a continuation-in-part of U.S. Ser. No. 10/228,358, filed on Aug. 26, 2002 (issued as U.S. Pat. No. 6,774,018), which is a continuation-in-part of Ser. No. 09/660,003, filed on Sep. 12, 2000 (issued as U.S. Pat. No. 6,441,553), a continuation-in-part of Ser. No. 09/241,882, filed on Feb. 1, 1999 (issued as U.S. Pat. No. 6,118,218).

BACKGROUND OF THE INVENTION

1. Field of the Invention

This invention relates generally to barrier films; in particular, the invention relates to films and coatings with improved barrier characteristics produced by combining atmospheric glow-discharge plasma treatment and precursor deposition with various curing steps and/or post-deposition treatments tailored to optimize end results specific to each particular applications.

2. Description of the Related Art

As detailed in U.S. Pat. No. 6,774,018, glow-discharge plasma treatment has been an effective method of treating surfaces to increase their wettability and adhesion to various materials. Glow discharge provides a uniform and homogenous plasma that produces a consistent surface treatment with high-energy electrons that collide with, dissociate and ionize low-temperature neutrals, thereby creating highly reactive free radicals and ions. These reactive species enable many chemical processes to occur with otherwise unreactive low-temperature feedstock and substrates. Based on these properties, low-density glow-discharge plasmas are usually utilized for low material-throughput processes involving surface modification.

These plasmas are typically formed by partially ionizing a gas at a pressure well below atmosphere. For the most part, these plasmas are weakly ionized, with an ionization fraction of $10^{-5}$ to $10^{-1}$, established with AC or DC power in systems with varied geometries. These systems require vacuum chambers and pumps to maintain a very low pressure, which increases operating and maintenance costs. Accordingly, there has been an extensive effort in recent years to develop plasma systems capable of operating at atmospheric pressure for surface treatment of polymer films, foils, and paper.

It is known that atmospheric plasma can be generated at relatively low temperatures with a proper power source, the insertion of a dielectric layer between the electrodes, and the use of an appropriate gas mixture as the plasma medium. For surface treatment of polymer films, fabrics, paper, etc., atmospheric plasma can be established between two electrodes using an inert gas such as helium under particular operating conditions. Usually one electrode is attached to a high voltage power supply and a rotating drum is grounded and acts as the other electrode. One electrode is coated with a ceramic layer and the plasma gas is injected between electrodes. Examples of such glow-discharge plasma systems operating at atmospheric pressure are described in U.S. Pat. Nos. 5,387,842, 5,403,453, 5,414,324, 5,456,972, 5,558,843, 5,669,583, 5,714,308, 5,767,469, and 5,789,145.

U.S. Pat. No. 6,118,218, incorporated herein by reference, disclosed a plasma treatment system capable of producing a steady glow discharge at atmospheric pressure with a variety of gas mixtures operating at frequencies as low as 60 Hz. That invention involves incorporating a porous metallic layer in one of the electrodes of a conventional plasma treatment system. A plasma gas is injected into the electrode at substantially atmospheric pressure and allowed to diffuse through the porous layer, thereby forming a uniform glow-discharge plasma. As in prior-art devices, the material to be treated is exposed to the plasma created between this electrode and a second electrode covered by a dielectric layer. Because of the micron size of the pores of the porous metal, each pore also produces a hollow cathode effect that facilitates the ionization of the plasma gas. As a result, a steady-state glow-discharge plasma is produced at atmospheric pressure and at power frequencies as low as 60 Hz. In order for the electrode holes to operate effectively for producing an optimal glow discharge, their size must approach the mean free path of the plasma gas at the system's operating pressure.

U.S. Pat. No. 6,441,553, herein incorporated by reference, discloses a further improvement in the art as a result of the discovery that the porous metallic layer of U.S. Pat. No. 6,118,218 may be used in conjunction with novel electrode arrangements to overcome the substrate-thickness limitations imposed by conventional plasma-treatment apparatus. In an exemplary embodiment, the invention consists of two metallic electrodes embedded side by side in a dielectric medium having an outer layer defining an exposed treatment space (the plasma zone). One of the electrodes is made of a porous metal and serves as a conduit for introducing the plasma gas into the treatment space at substantially atmospheric pressure. The two electrodes are energized in conventional manner, using one of the electrodes as a ground, to create an electric field between them and produce a uniform glow-discharge plasma in the treatment space (i.e., the plasma zone). Thus, the material to be treated can be exposed to the plasma so created without substantial limitation as to thickness, geometry and composition. By eliminating the need to maintain an electric field across the substrate being treated, the electrode assembly of the invention makes it possible to treat thick substrates and substrates of metallic composition that could not be treated with prior-art equipment. In addition, a powdery substrate can be treated by adding a shaker to a belt used to convey the substrate through the plasma field.

According to another advance in the use of atmospheric plasma disclosed in U.S. Pat. No. 6,441,553, herein incorporated by reference, vapor deposition is carried out in combination with plasma treatment by vaporizing a substance of interest, mixing it with the plasma gas, and diffusing the mixture through the porous electrode. A heater is provided to maintain, if necessary, the temperature of the electrode above the condensation temperature of the substance in order to prevent deposition during diffusion. Thus, plasma treatment and vapor deposition are carried out on a target substrate at the same time at atmospheric pressure.

The invention of U.S. Pat. No. 6,441,553 lies in the combination of vapor deposition and plasma treatment at atmospheric pressure using certain classes of evaporable liquid and solid materials to produce films and coatings with specifically improved barrier properties. Inasmuch as similar coatings have been produced using vapor deposition and plasma treatment under vacuum, many useful gases (i.e., vapors at ambient conditions) and vaporizable constituents are known from the prior art that can also be used advantageously in the atmospheric-pressure process of the invention (such materials are typically referred to as "precursors" in the art).

U.S. Pat. No. 6,774,018, herein also incorporated by reference, provides a further development in the art of using atmospheric-plasma treatment to improve conventional deposition and surface treatment processes. A plasma gas at atmospheric pressure is used with various vapor precursors, such as silicon-based materials, fluorine-based materials, chlorine-based materials, and organo-metallic complex materials, to enable the manufacture of coated substrates with improved properties with regard to moisture-barrier, oxygen-barrier, hardness, scratch- and abrasion-resistance, chemical-resistance, low-friction, hydrophobic and/or oleophobic, hydrophilic, biocide and/or antibacterial, and electrostatic-dissipative/conductive characteristics.

U.S. Ser. No. 10/883,176 and the present invention are the result of further developments in the art. They discloses various atmospheric techniques wherein plasma treatment is combined with precursor deposition and other process steps common in the art, such as curing with ultraviolet, visible, or infrared light, electron-beam radiation, and pre-and/or post-deposition plasma treatment, to further improve the final product.

BRIEF SUMMARY OF THE INVENTION

The gist of this invention is in the combination of the atmospheric plasma process rendered possible by the inventions disclosed in related applications with various other steps known in the art of vacuum deposition in order to further improve the quality of the products obtained through atmospheric plasma processing. In particular, the invention is directed at the atmospheric-pressure manufacture of films and sheets (coating layers, in general) with improved barrier properties to moisture and oxygen for use in packaging, displays and electronic applications wherein the process of manufacture includes curing a deposited precursor layer by exposure to UV light, or visible light, infrared light, electron-beam radiation, and further by atmospheric plasma pre-treatment.

Therefore, the preferred embodiment of the invention consists of producing an atmospheric plasma in a treatment space by passing a plasma gas through a porous layer and subjecting it to an electric field produced by two metallic electrodes separated by a dielectric material; exposing a substrate to the plasma field; coating the substrate by vapor deposition of a precursor material at atmospheric pressure during or immediately past the exposure to the plasma field; curing the precursor so deposited by exposure to ultraviolet light in the presence of a photoinitiator; and finally further treating the surface of the precursor material to enhance curing and to smooth the coated surface.

In another embodiment of the invention, the substrate is first pre-treated with a plasma gas to clean the surface, a precursor is deposited in a plasma field at atmospheric pressure, and the deposited layer is cured by exposure to visible light in the presence of a photoinitiator. The coating is then post-treated with a plasma gas to enhance curing and smoothness. In another embodiment, the precursor film formed by vapor deposition is cured with an electron beam and is further post-treated with a plasma gas to enhance its finished properties. In yet another embodiment, the curing stage is accomplished with an infrared light, followed by further plasma treatment to enhance curing and to smooth the coated surface.

According to another aspect of the invention, the precursor is atomized and sprayed at atmospheric pressure, rather than vapor deposited, over the substrate either during or immediately after exposure to the plasma field. Various precursors so deposited are then alternatively cured using UV light, IR light, visible light, or an electron-beam gun, depending on the desired finished properties, as in the case of vapor deposited precursors. Plasma post-treatment is also preferred in all cases to enhance curing and smooth the coated surface.

Various other purposes and advantages of the invention will become clear from its description in the specification that follows and from the novel features particularly pointed out in the appended claims. Therefore, to the accomplishment of the objectives described above, this invention consists of the features hereinafter illustrated in the drawings, fully described in the detailed description of the preferred embodiment and particularly pointed out in the claims. However, such drawings and description disclose only some of the various ways in which the invention may be practiced.

DESCRIPTION OF THE PREFERRED
EMBODIMENTS OF THE INVENTION

This invention utilizes the advantages produced by the plasma-treatment electrodes disclosed in U.S. Ser. No. 09/660,003 and U.S. Pat. No. 6,118,218 to improve the surface properties of coated substrates manufactured by plasma-enhanced vapor deposition at atmospheric pressure. Accordingly, the invention may be carried out using the various embodiments of the apparatus described in those disclosures, which are herein incorporated by reference in their entirety. In addition, the present invention utilizes various curing and plasma-treatment units operated in line with those described in the referenced patents.

Figure 1:
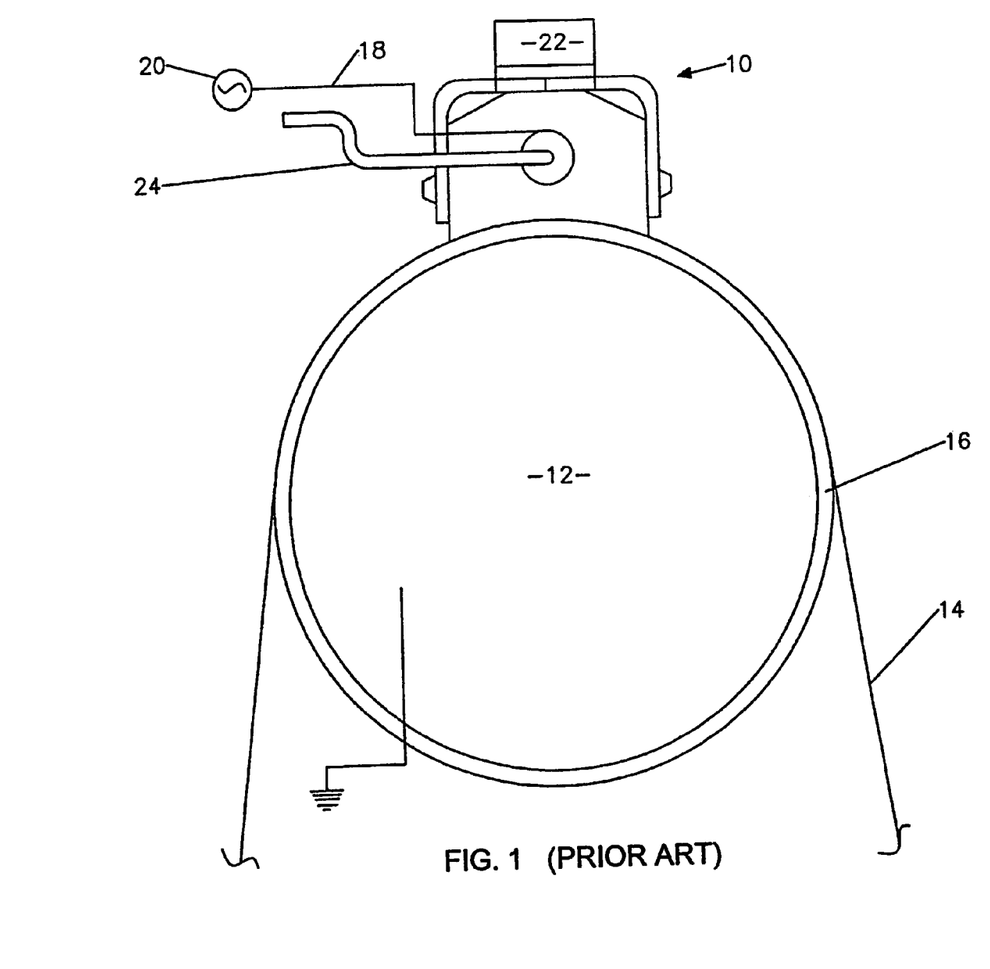
FIG. 1 is a schematic representation of a conventional plasma-treater configuration.

Referring to the drawings, wherein like parts are designated throughout with like numerals and symbols, FIG. 1 shows a general layout of an atmospheric plasma treater assembly wherein a plasma treater 10 is shown mounted opposite to the roller 12 of a conventional web-treatment system. A web or film 14 of material to be treated is passed through the assembly between the plasma treater and the roller at speeds typically ranging from 1 to 200 meter/min. The roller 12 is grounded and coated with a dielectric material 16, such as polyethylene teraphthalate (PET). The plasma treater 10 contains at least one electrode as described in U.S. Pat. No. 6,118,218, which is connected, through a cable 18, to an AC power supply 20 operating at any frequency between 60 Hz and the maximum frequency available from the power supply. The treater 10 is held in place conventionally by a holding bracket 22 to maintain a distance of 1-2 mm between the dielectric layer 16 and the treater 10. Plasma gas, such as helium, argon, and mixtures of an inert gas with nitrogen, oxygen, air, carbon dioxide, methane, acetylene, propane, ammonia, or mixtures thereof, can be used with this treater to sustain a uniform and steady plasma at atmospheric pressure. The gas is supplied to the treater 10 through a manifold 24 that feeds the porous electrode of the invention.

Figure 2:
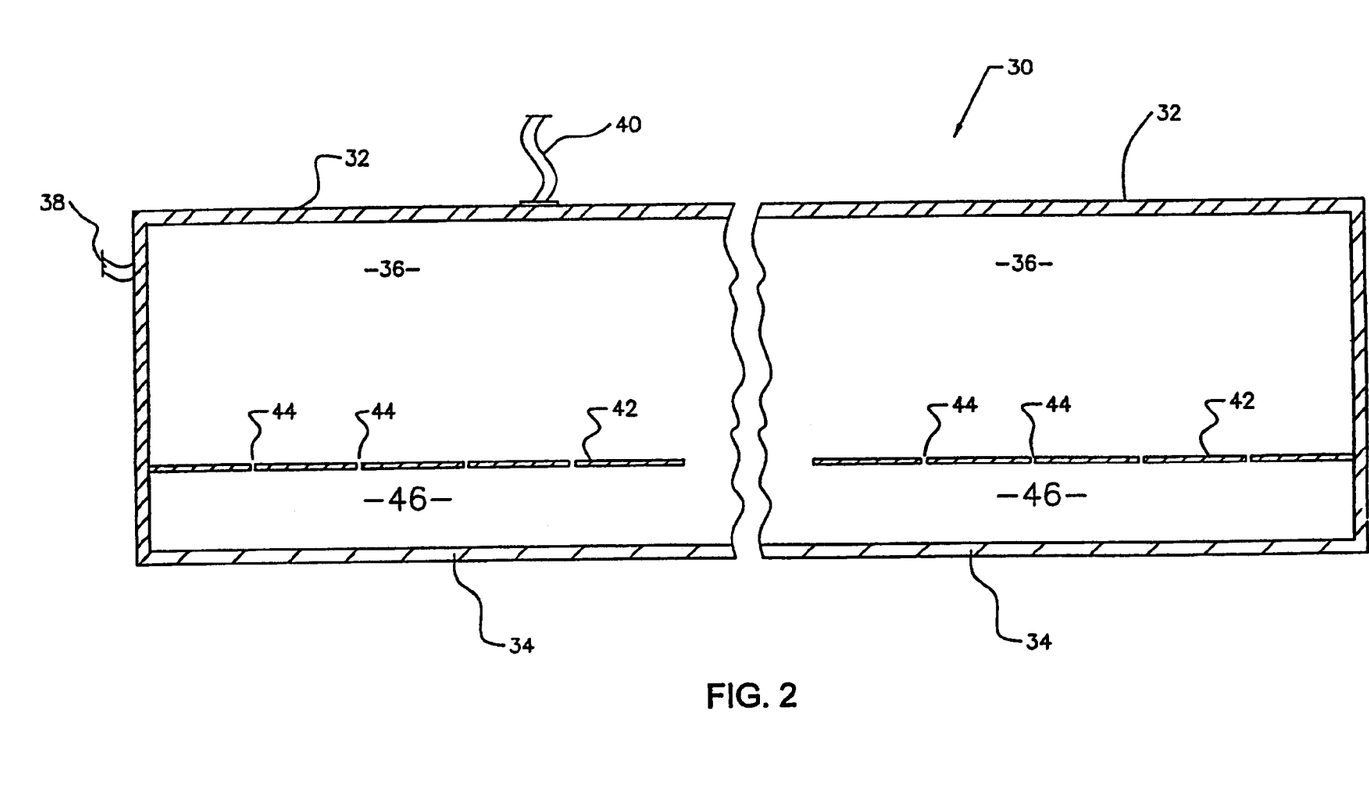
FIG. 2 is a partially cut-out, side sectional view of an electrode containing a porous-metal component according to the invention.

As shown in FIG. 2, an embodiment of a porous electrode 30 incorporated within the treater 10 consists of a hollow housing 32 with a porous metal layer 34 having pores sized to approximate the mean free path of the plasma gas intended to be used in the treater. The gas is fed to the upper portion 36 of the hollow electrode 30 at substantially atmospheric pressure through an inlet pipe 38 connected to the exterior manifold 24. The electrode is energized by an electrical wire 40 connected to the power system through the exterior cable 18. The electrode 30 preferably includes a distribution baffle 42 containing multiple, uniformly spaced apertures 44 designed to distribute the gas uniformly throughout the length of the bottom portion 46 of the hollow electrode 30.

In the alternative, any one of several side-by-side embodiments of porous electrode can be used to practice the invention, as disclosed in U.S. Pat. No. 6,441,553 and exemplified herein in FIG. 3. Such an electrode unit 50 may consist, for example, of a pair of electrodes encased in a dielectric housing 52, such as a ceramic structure. A first, conventional electrode 54 is coupled to a porous electrode 56 made of the same type of porous material described in U.S. Pat. No. 6,118,218. The two electrodes are placed side by side facing the process space or zone 58 where the target substrate is intended to be treated. The electrode assembly 50 is energized by an AC power source 20 and grounded through a ground 60 in conventional manner using either electrode as the ground. An inlet port 62 is connected to the porous electrode 56 to feed the plasma gas to the unit 50 through the porous metal constituting the electrode. The dielectric housing 52 between the porous electrode 56 and the boundary of the process space 58 may also include a dielectric layer 64 that consists of a porous portion capable of diffusing plasma gas received from the porous electrode into the process space. Alternatively, the porous dielectric layer 64 may be used with a hollow electrode (instead of a porous electrode 56) for diffusing the plasma gas into the process space 58.

Figure 3:
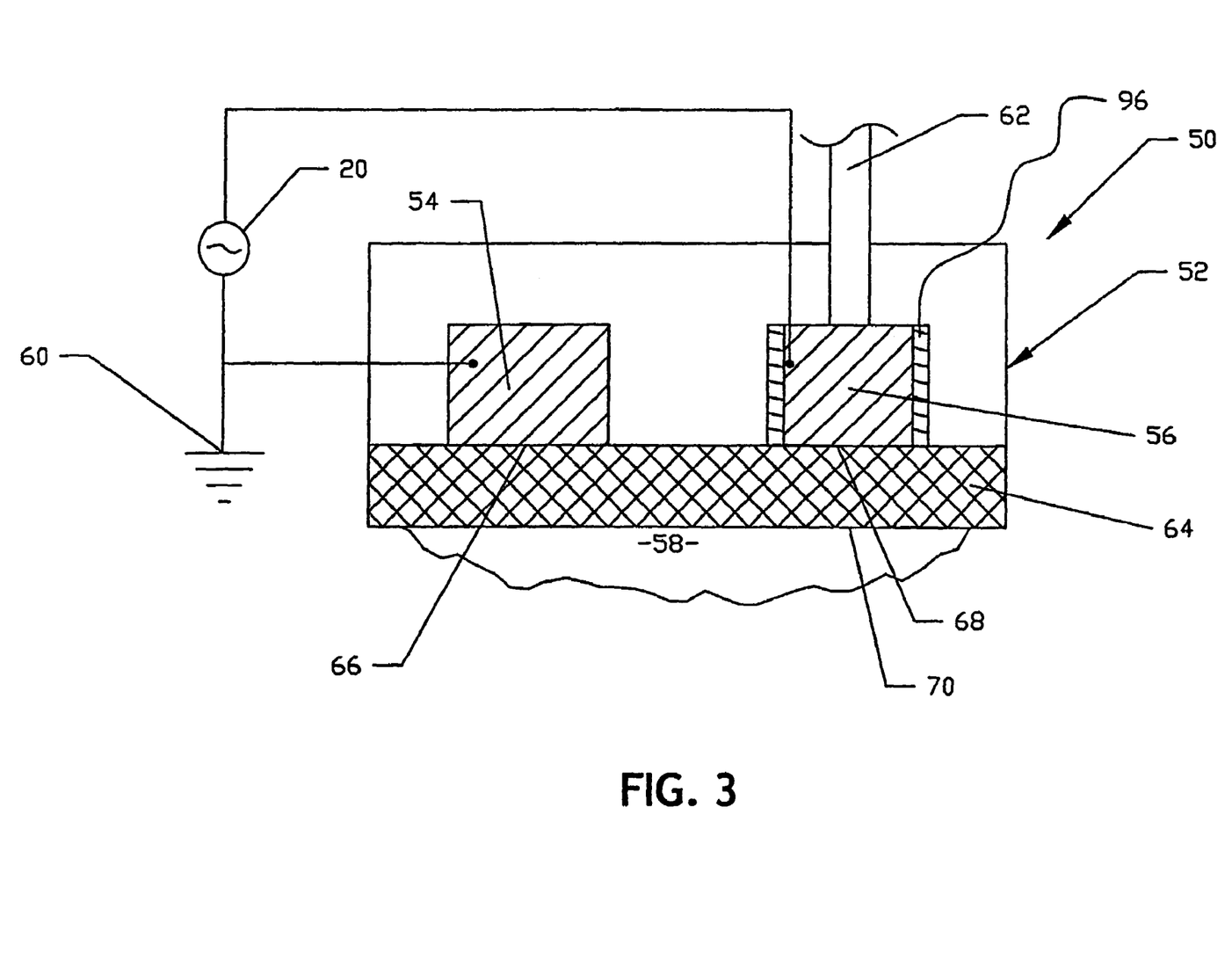
FIG. 3 is a schematic representation of an electrode assembly according to the invention wherein a porous-metal structure is used as an electrode as well as a perfusion medium in side-by-side combination with a conventional electrode encased in a dielectric medium.

As a result of this configuration, an electric field is produced across the process space 58 when the electrode pair 54,56 is energized in conventional manner. The plasma gas is diffused at substantially atmospheric pressure through the porous electrode 56 and the dielectric layer 64 (or a hollow electrode and a porous dielectric layer 64) into the process space 58 where the electric field produces a steady-state glow-discharge plasma at power frequencies as low as 60 Hz. For best results, the sides 66 and 68 of the two electrodes facing the process space are substantially aligned with the exposed surface 70 of the porous dielectric layer 64, thereby promoting coupling of the two electrodes and producing an electric field across the process space along a plane aligned with the sides 66,68. Using this side-by-side embodiment of the invention, the treatment space 58 can be expanded without limitations imposed by the need to establish an electric field between the electrode and a grounded roller 12, as was the case prior to the invention disclosed in Ser. No. 09/660,003.

Figure 4:
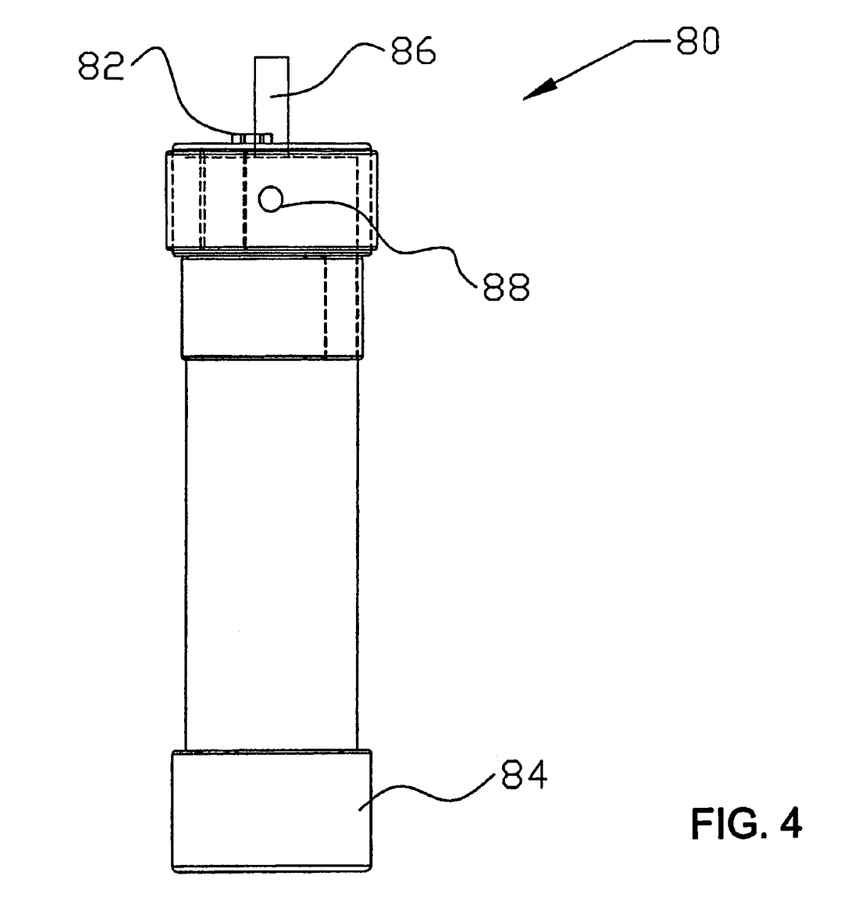
FIG. 4 is a schematic view of an evaporator used to practice the combined vapor-deposition and plasma-treatment processes of the invention at atmospheric pressure.
Figure 5:
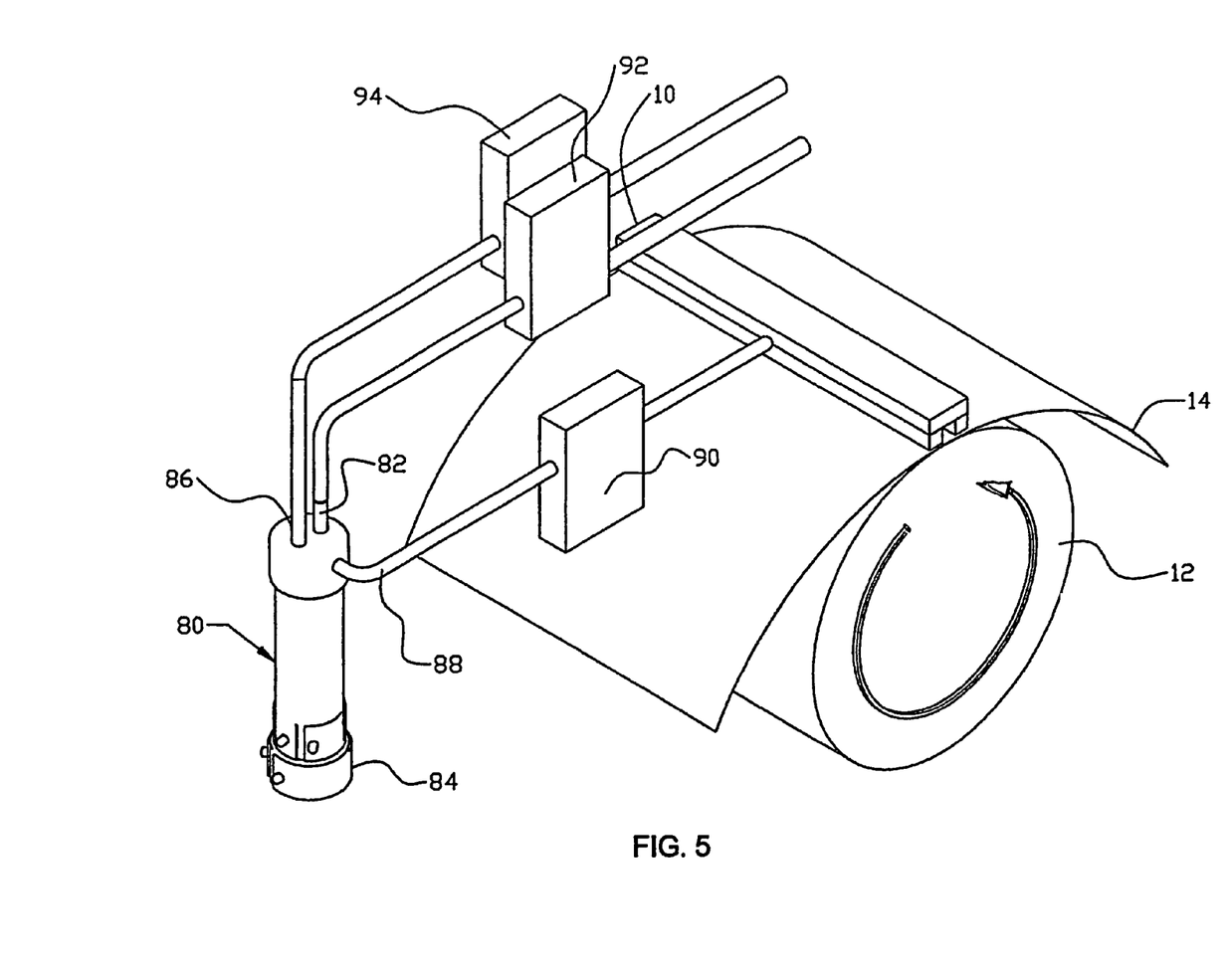
FIG. 5 is a schematic view of the plasma treater configuration of FIG. 1 incorporating the evaporator of FIG. 4 for atmospheric treatment according to the invention by mixing plasma gas and coating precursor prior to injection through the electrode.

In order to practice the present invention, the treater assembly of FIG. 1 is preferably coupled to an evaporator 80, such as illustrated separately in FIG. 4, in order to provide the capability of evaporating liquid and solid precursors. The coating precursor to be deposited by vapor deposition on a given substrate is fed to the evaporator 80 through an inlet port 82 and is heated to its evaporation temperature by heating bands 84 at the bottom of the evaporator. If a gaseous precursor is being used, it passes through the unit without effect (or it may be passed through a bypass channel and injected directly into the treatment area). If a solid precursor is being used, it is liquefied prior to feeding it to the evaporator 80. Plasma gas is also supplied to the evaporator through a separate port 86 and is mixed with the gas or vaporized material prior to being fed to the electrode (30, 50 or equivalent porous electrode) through an outlet duct 88. FIG. 5 shows the combination of the evaporator 80 with a plasma-treatment unit of the type illustrated in FIG. 1, wherein the flow rate of the precursor/plasma-gas mixture to the electrode is controlled by a flowmeter 90 and the flow rates of the precursor and plasma gas into the evaporator 80 are regulated by additional appropriate flowmeters 92 and 94, respectively.

As illustrated schematically with reference to the embodiment 50 of FIG. 3, a heater element 96 may also be used around the porous electrode to maintain the vaporized state of any liquid or solid precursor used in the process while the gas/vapor mixture is diffused through the porous electrode 56 (or equivalent electrode). As would be clear to one skilled in the art, the heater 96 must be capable of maintaining the electrode temperature uniformly above the vaporization temperature of the deposition material at atmospheric pressure. A temperature range from 70° C. to 100° C. has been found to be sufficient for most materials of interest. It is noted that the use of a side-by-side electrode enables plasma treatment without a dielectric coating 16 over the drum 12.

Figure 6:
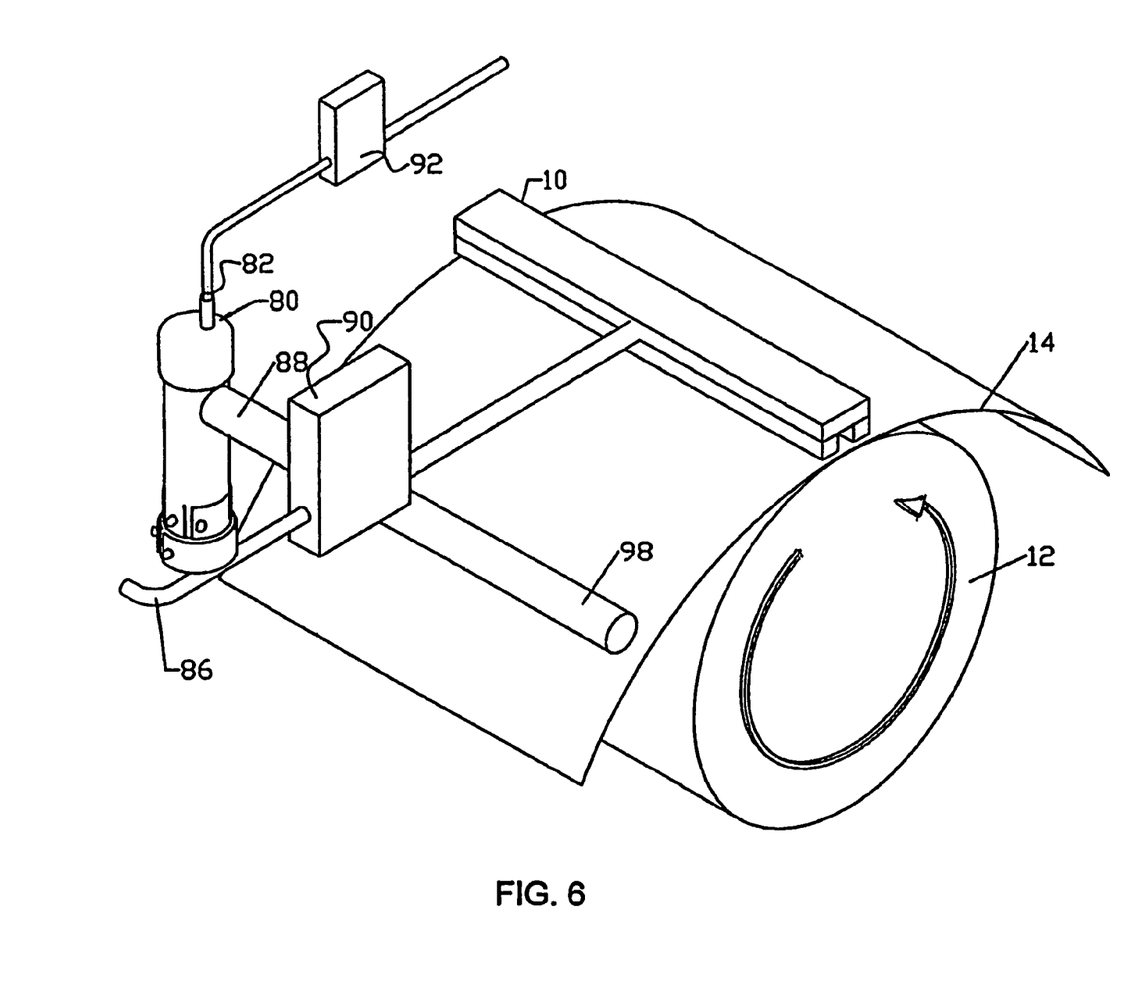
FIG. 6 is a schematic view of the plasma treater configuration of FIG. 5, wherein the coating precursor is injected directly over the substrate immediately after its plasma treatment.

In an alternative embodiment of the invention, the evaporator 80 is used only to evaporate the precursor material, if necessary, separately from the plasma gas. The evaporated material is then injected directly in the vicinity of the plasma field, as illustrated in FIG. 6, after passing the substrate through the treatment space between the plasma treater 10 and the drum 12. The precursor vapor is injected through a slitted nozzle 98 placed across the web 14, such that the vapor is directed for deposition toward the substrate under the influence of the plasma field created by the treater 10. The plasma gas is injected separately through the porous electrode in the treater 10 to provide the plasma field in the process space.

According to still another embodiment if the invention suitable for the deposition of liquid precursors, the precursor is atomized and sprayed onto the substrate as it passes through the plasma field. Surprisingly, so long as the particle size of the atomized liquid permits the formation of a liquid film of desired thickness over the substrate, the effect of the plasma field and the subsequent curing by the same methods utilized with vapor deposition produce comparable results.

Figure 7:
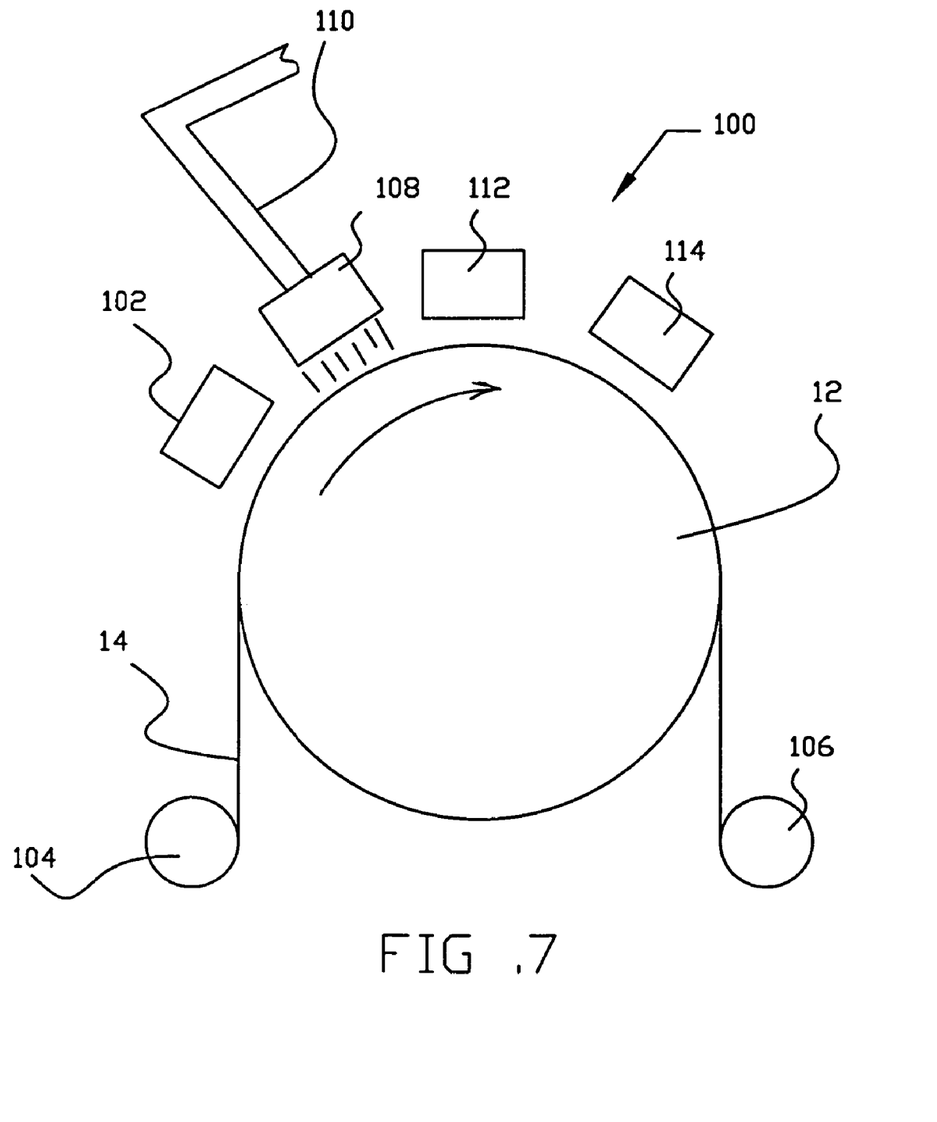
FIG. 7 is a schematic representation of an atmospheric vapor deposition system according to the invention, wherein the steps of plasma pre-treatment, vapor deposition, monomer curing, and plasma post-treatment are carried out successively in line over a moving substrate.

The present invention contemplates additional steps to improve adhesion and smoothness in the finished product. Accordingly, several treatment units are combined in line in a single system 100, as illustrated schematically in FIG. 7, to afford the versatility required to tailor each deposition process to the requirements of the finished product. The system 100 may comprise a first atmospheric plasma-treatment unit 102 to clean the surface of the web or other substrate 14 being coated while it passes continuously over the drum 12 from a feed roller 104 to a take-up roller 106. If used, this plasma treatment is performed conventionally to clean the surface of the substrate to improve adhesion by removing moisture and other small molecules. A vapor-deposition/plasma unit 108 according to the invention is then used, in the configuration detailed in either FIG. 5 or FIG. 6, to deposit a vaporized precursor as detailed in U.S. Ser. No. 10/228,358. A precursor source 110 may be incorporated into or used in conjunction with the plasma unit 108. Obviously, the plasma unit 102 would be substantially redundant, and therefore unnecessary, in the configuration of FIG. 6. A curing station 112 is then used after the vapor deposition to polymerize the precursor and form a solid film over the substrate 14. The station 112 may consist of an infrared lamp, an electron-beam unit, an ultraviolet lamp, or a visible light source. In the last two cases, an appropriate photoinitiator is added to the precursor prior to vaporization. Finally, another plasma-treatment unit 114 may be used to enhance curing and to smooth the surface of the coating film. In another embodiment of the invention illustrated in FIG. 8, the precursor is atomized, rather than vaporized, and sprayed onto the plasma-treated surface through a nozzle 120 used in the configuration of FIG. 6 (where it replaces the slitted nozzle 98).

Organic substrates such as polypropylene, polyethylene, and polyethylene teraphthalate of various thickness were coated according to the invention using various materials with desirable properties for specific objectives. For instance, polyester substrates were coated by vapor deposition in a helium plasma at atmospheric pressure using vaporized silicon-based materials (e.g., siloxanes, alkyl silanes, silazanes, and silsesquioxanes) mixed with the plasma-gas stream and diffused into the treatment area. The resulting products exhibited improved surface properties with regard to moisture- and oxygen-barrier characteristics, hardness, scratch and abrasion resistance, chemical resistance, and low friction. The same plasma gases and fluorosilicones were also used for vapor deposition under the same conditions by plasma treatment passing the substrate through the treater where the plasma gas was diffused into the process space followed by separate injection (through a slitted nozzle) and deposition of the precursor over the substrate. Similarly positive results were obtained with fluorine-based precursors (e.g., fluorocarbons, fluoro-silicones) to provide hydrophobic and/or oleophobic properties. Chlorine-based precursors (e.g., chloro-carbons, chloro-silicones) were used to produce biocide (including antibacterial) and barrier properties; and organo-metallic complex precursors (e.g., silver, copper, boron or aluminum complex) were used to produce electrostatic, dissipative, conductive, biocidal and barrier properties.

Thus, according to the invention, the substrate is treated with a plasma gas at atmospheric conditions, it is at the same time coated with a precursor, the deposited precursor layer is cured according to the most appropriate method for the particular application, and an additional plasma treatment is preferably utilized to complete curing and further improve the properties of the finished product. The following examples illustrate the combination of process steps that characterize the invention. All tests reported below are representative of many more similar tests carried out over a wide range of operating conditions and combinations of materials using a helium plasma gas and a precursor in proportions varying from 10 to 98% by volume of plasma gas (about 90% plasma gas being preferred, the balance being vapor precursor). The plasma gas and the vapor precursor were fed to the treater (together or separately, as described above with reference to FIGS. 5 and 6) at a combined rate varying from extremes of about 100 to about 10,000 sccm (standard cubic centimeters per minute). In the case of atomized precursor, it was fed into the plasma gas at a rate of about 10-100 ml/min (atomized) in a range of plasma gas also varying from extremes of about 100 to about 10,000 sccm. The electrode assembly operated with a porous component with average pore size in the range of 1-20 microns. The substrate material to be treated was passed through the treatment space of 12-inch plasma treaters facing a conventional rotating drum. The tests were conducted at frequencies ranging from about 20 KHz to about 13.5 MHz. The following examples are indicative of preferred ranges and conditions.

EXAMPLE 1

Atmospheric Plasma Treatment with Vapor Deposition; UV-Light Curing

Substrate Material: PET Film Run at Line Speed of 200 ft/min

1. Atmospheric Plasma Treatment with Vapor Deposition. An atmospheric glow discharge was produced by feeding helium at 2000 sccm and an AC-voltage frequency of 20 KHz. Liquid fluoroacrylate monomer (with 5% Irgacure-184 photoinitiator) was evaporated at 200-250° C. and the vapor was mixed at a rate of 200 sccm with the plasma gas prior to injection, as shown in FIG. 5.

2. Curing. The condensed vapor was exposed to a Low-Pressure Mercury UV Lamp at 300 Watt/inch.

The resulting coated product exhibited hydrophobic and oleophobic properties with excellent adhesion to the substrate. Similar results were obtained when polypropylene, polyethylene, polycarbonate, polyamide, polyimide and cellulose derivative films were treated/coated according to Example 1. The same experiment was repeated with paper and fabrics (woven and nonwoven). Similar hydrophobicity and oleophobicity were obtained with other precurtsors, such as perfluoropolyethylene glycols, perfluorovinyl monomers, and fluorinated alcohols.

EXAMPLE 2

Atmospheric Plasma Treatment; Valor Deposition; UV-Light Curing

Substrate Material: PET Film Run at Line Speed of 200 ft/min

1. Atmospheric Plasma Treatment with Vapor Deposition. An atmospheric glow discharge was produced by feeding helium at 2000 sccm and an AC-voltage frequency of 20 KHz. Liquid fluoroacrylate monomer (with 5% Irgacure-184 photoinitiator) was evaporated at 200-250° C. and the vapor was injected separately from the plasma gas, at a rate of 200 sccm, in the vicinity of the plasma zone, as shown in FIG. 6.

2. Curing. The condensed vapor was exposed to a Low-Pressure Mercury UV Lamp at 300 Watt/inch.

The resulting coated product exhibited substantially the same hydrophobic and oleophobic properties with excellent adhesion to the substrate as the product produced in Example 1. The same results were also obtained with polypropylene, polyethylene, polycarbonate, polyamide, polyimide and cellulose derivative films deposited in line immediately after plasma treatment, as illustrated in FIG. 6. The same experiment was repeated with paper and fabrics (woven and nonwoven), with similar hydrophobicity and oleophobicity results. Other precursors, such as perfluoropolyethylene glycols and fluorinated alcohols, were also tested with comparable results.

EXAMPLE 3

Atmospheric Plasma Treatment; Vapor Deposition; Visible-Light Curing; Plasma Post-Treatment Substrate Material: PET Film Run at Line Speed of 200 ft/min 1. Atmospheric Plasma Treatment with Vapor Deposition. An atmospheric glow discharge was produced by feeding helium at 3000 sccm and an AC-voltage frequency of 20 KHz. Liquid fluoroacrylate monomer (with 5% H-NU-635 photoinitiator) was evaporated at 200-250° C. and the vapor was injected separately from the plasma gas, at a rate of 200 sccm, in the vicinity of the plasma zone, as shown in FIG. 6.

2. Curing. The condensed vapor was exposed to a Tungsten-Halogen Lamp at 100 Watt/inch.

3. Plasma Post-Treatment. The cured coating was exposed to atmospheric plasma created with helium with 5% tetrafluoromethane (fed at a combined feed rate of 3000 sccm) and an AC-voltage frequency of 20 KHz The resulting coated product exhibited hydrophobic and oleophobic properties with excellent adhesion to the substrate.

EXAMPLE 4

Atmospheric Plasma Treatment; Vapor Deposition; Visible-Light Curing; Plasma Post-Treatment Substrate Material: PET Film Run at Line Speed of 200 ft/min 1. Atmospheric Plasma Treatment with Vapor Deposition. An atmospheric glow discharge was produced by feeding helium with 10% oxygen (by volume) at a total rate of 3000 sccm and an AC-voltage frequency of 20 KHz. Liquid fluoroacrylate monomer (with 5% H-NU-635 photoinitiator) was evaporated at 200-250° C. and the vapor was injected separately from the plasma gas, at a rate of 200 sccm, in the vicinity of the plasma zone, as shown in FIG. 6.

2. Curing. The condensed vapor was exposed to a Tungsten-Halogen Lamp at 100 Watt/inch.

3. Plasma Post-Treatment. The cured coating was exposed to atmospheric plasma created with helium with 5% tetrafluoromethane (fed at a combined feed rate of 3000 sccm) and an AC-voltage frequency of 15 KHz The resulting coated product exhibited hydrophobic and oleophobic properties with excellent adhesion to the substrate.

EXAMPLE 5

Atmospheric Plasma Treatment; Vapor Deposition; Visible-Light Curing; Plasma Post-Treatment Substrate Material: PET Film Run at Line Speed of 200 ft/min 1. Atmospheric Plasma Treatment with Vapor Deposition. An atmospheric glow discharge was produced by feeding helium at 3000 sccm and an AC-voltage frequency of 20 KHz. Liquid polyethyleneglycol monoacrylate (with 5% H-NU-635 photoinitiator) was evaporated at 200-250° C. and the vapor was injected separately from the plasma gas, at a rate of 200 sccm, in the vicinity of the plasma zone, as shown in FIG. 6.

2. Curing. The condensed vapor was exposed to a Tungsten-Halogen Lamp at 100 Watt/inch.

3. Plasma Post-Treatment. The cured coating was exposed to atmospheric plasma created with helium with 5% acetylene (fed at a combined feed rate of 3000 sccm) and an AC-voltage frequency of 15 KHz The resulting coated product exhibited hydrophilic and anti-fog properties with excellent adhesion to the substrate.

EXAMPLE 6

Atmospheric Plasma Treatment; Vapor Deposition; Visible-Light Curing; Plasma Post-Treatment Substrate Material: PET Film Run at Line Speed of 200 ft/min 1. Atmospheric Plasma Treatment with Vapor Deposition. An atmospheric glow discharge was produced by feeding helium at 3000 sccm and an AC-voltage frequency of 20 KHz. Liquid acrolin and/or chlorinated acrylate (with 5% H-NU-635 photoinitiator) was evaporated at 200-250° C. and the vapor was injected separately from the plasma gas, at a rate of 200 sccm, in the vicinity of the plasma zone, as shown in FIG. 6.

2. Curing. The condensed vapor was exposed to a Tungsten-Halogen Lamp at 100 Watt/inch.

3. Plasma Post-Treatment. The cured coating was exposed to atmospheric plasma created with helium with 5% acetylene (fed at a combined feed rate of 3000 sccm) and an AC-voltage frequency of 15 KHz The resulting coated product exhibited biocide, anti-bacterial properties with excellent adhesion to the substrate.

EXAMPLE 7

Atmospheric Plasma Treatment; Vapor Deposition; IR-Light Curing; Plasma Post-Treatment Substrate Material: PET Film Run at Line Speed of 20 ft/min 1. Atmospheric Plasma Treatment with Vapor Deposition. An atmospheric glow discharge was produced by feeding helium at 3000 sccm and an AC-voltage frequency of 20 KHz. Liquid fluoroacrylate monomer was evaporated at 200-250° C. and the vapor was injected separately from the plasma gas, at a rate of 200 sccm, in the vicinity of the plasma zone, as shown in FIG. 6.

2. Curing. The condensed vapor was exposed to an Infrared Lamp at 500 Watt.

3. Plasma Post-Treatment. The cured coating was exposed to atmospheric plasma created with helium with 5% tetrafluoromethane (fed at a combined feed rate of 3000 sccm) and an AC-voltage frequency of 15 KHz The resulting coated product exhibited hydrophobic and oleophobic properties with excellent adhesion to the substrate.

EXAMPLE 8

Atmospheric Plasma Treatment; Vapor Deposition; IR-Light Curing; Plasma Post-Treatment Substrate Material: PET Film Run at Line Speed of 20 ft/min 1. Atmospheric Plasma Treatment with Vapor Deposition. An atmospheric glow discharge was produced by feeding helium with 10% (by volume) at a total rate of 3000 sccm and an AC-voltage frequency of 20 KHz. Liquid fluoroacrylate monomer was evaporated at 200-250° C. and the vapor was injected separately from the plasma gas, at a rate of 200 sccm, in the vicinity of the plasma zone, as shown in FIG. 6.

2. Curing. The condensed vapor was exposed to an Infrared Lamp at 500 Watt.

3. Plasma Post-Treatment. The cured coating was exposed to atmospheric plasma created with helium with 5% tetrafluoromethane (fed at a combined feed rate of 3000 sccm) and an AC-voltage frequency of 15 KHz The resulting coated product exhibited hydrophobic and oleophobic properties with excellent adhesion to the substrate.

EXAMPLE 9

Atmospheric Plasma Treatment; Vapor Deposition; IR-Light Curing; Plasma Post-Treatment Substrate Material: PET Film Run at Line Speed of 20 ft/min 1. Atmospheric Plasma Treatment with Vapor Deposition. An atmospheric glow discharge was produced by feeding helium at 3000 sccm and an AC-voltage frequency of 20 KHz. Liquid polyethyleneglycol monoacrylate was evaporated at 200-250° C. and the vapor was injected separately from the plasma gas, at a rate of 200 sccm, in the vicinity of the plasma zone, as shown in FIG. 6.

2. Curing. The condensed vapor was exposed to an Infrared Lamp at 500 Watt.

3. Plasma Post-Treatment. The cured coating was exposed to atmospheric plasma created with helium with 5% acetylene (fed at a combined feed rate of 3000 sccm) and an AC-voltage frequency of 15 KHz The resulting coated product exhibited hydrophilic and anti-fog properties with excellent adhesion to the substrate.

EXAMPLE 10

Atmospheric Plasma Treatment; Vapor Deposition; IR-Light Curing; Plasma Post-Treatment Substrate Material: PET Film Run at Line Speed of 20 ft/min 1. Atmospheric Plasma Treatment with Vapor Deposition. An atmospheric glow discharge was produced by feeding helium at 3000 sccm and an AC-voltage frequency of 20 KHz. Liquid acrolin and/or chlorinated acrylate was evaporated at 200-250° C. and the vapor was injected separately from the plasma gas, at a rate of 200 sccm, in the vicinity of the plasma zone, as shown in FIG. 6.

2. Curing. The condensed vapor was exposed to an Infrared Lamp at 500 Watt.

3. Plasma Post-Treatment. The cured coating was exposed to atmospheric plasma created with helium with 5% acetylene (fed at a combined feed rate of 3000 sccm) and an AC-voltage frequency of 15 KHz The resulting coated product exhibited biocide, anti-bacterial properties with excellent adhesion to the substrate.

EXAMPLE 11

Atmospheric Plasma Treatment; Valor Deposition; Electron-Beam Curing; Plasma Post-Treatment Substrate Material: PET Film Run at Line Speed of 200 ft/min 1. Atmospheric Plasma Treatment with Vapor Deposition. An atmospheric glow discharge was produced by feeding helium at 3000 sccm and an AC-voltage frequency of 20 KHz. Liquid fluoroacrylate monomer was evaporated at 200-250° C. and the vapor was injected separately from the plasma gas, at a rate of 200 sccm, in the vicinity of the plasma zone, as shown in FIG. 6.

2. Curing. The condensed vapor was exposed to an Electrocurtain (Energy Science, Inc.).

3. Plasma Post-Treatment. The cured coating was exposed to atmospheric plasma created with helium with 5% tetrafluoromethane (fed at a combined feed rate of 3000 sccm) and an AC-voltage frequency of 15 KHz.

The resulting coated product exhibited hydrophobic and oleophobic properties with excellent adhesion to the substrate.

EXAMPLE 12

Atmospheric Plasma Treatment; Vapor Deposition; Electron-Beam Curing; Plasma Post-Treatment Substrate Material: PET Film Run at Line Speed of 200 ft/min 1. Atmospheric Plasma Treatment with Vapor Deposition. An atmospheric glow discharge was produced by feeding helium with 10% oxygen (by volume) at a total rate of 3000 sccm and an AC-voltage frequency of 20 KHz. Liquid fluoroacrylate monomer was evaporated at 200-250° C. and the vapor was injected separately from the plasma gas, at a rate of 200 sccm, in the vicinity of the plasma zone, as shown in FIG. 6.

2. Curing. The condensed vapor was exposed to an Electrocurtain (Energy Science, Inc.).

3. Plasma Post-Treatment. The cured coating was exposed to atmospheric plasma created with helium with 5% tetrafluoromethane (fed at a combined feed rate of 3000 sccm) and an AC-voltage frequency of 15 KHz.

The resulting coated product exhibited hydrophobic and oleophobic properties with excellent adhesion to the substrate.

EXAMPLE 13

Atmospheric Plasma Treatment; Valor Deposition; Electron-Beam Curing; Plasma Post-Treatment Substrate Material: PET Film Run at Line Speed of 200 ft/min 1. Atmospheric Plasma Treatment with Vapor Deposition. An atmospheric glow discharge was produced by feeding helium at 3000 sccm and an AC-voltage frequency of 20

KHz. Liquid polyethyleneglycol monoacrylate was evaporated at 200-250° C. and the vapor was injected separately from the plasma gas, at a rate of 200 sccm, in the vicinity of the plasma zone, as shown in FIG. 6.

2. Curing. The condensed vapor was exposed to an Electrocurtain (Energy Science, Inc.).

3. Plasma Post-Treatment. The cured coating was exposed to atmospheric plasma created with helium with 5% acetylene (fed at a combined feed rate of 3000 sccm) and an AC-voltage frequency of 15 KHz.

The resulting coated product exhibited hydrophilic and anti-fog properties with excellent adhesion to the substrate.

EXAMPLE 14

Atmospheric Plasma Treatment; Vapor Deposition; Electron-Beam Curing; Plasma Post-Treatment Substrate Material: PET Film Run at Line Speed of 200 ft/min 1. Atmospheric Plasma Treatment with Vapor Deposition. An atmospheric glow discharge was produced by feeding helium at 3000 sccm and an AC-voltage frequency of 20 KHz. Liquid liquid acrolin and/or chlorinated acrylate was evaporated at 200-250° C. and the vapor was injected separately from the plasma gas, at a rate of 200 sccm, in the vicinity of the plasma zone, as shown in FIG. 6.

2. Curing. The condensed vapor was exposed to an Electrocurtain (Energy Science, Inc.).

3. Plasma Post-Treatment. The cured coating was exposed to atmospheric plasma created with helium with 5% acetylene (fed at a combined feed rate of 3000 sccm) and an AC-voltage frequency of 15 KHz.

The resulting coated product exhibited biocide, antibacterial properties with excellent adhesion to the substrate.

Figure 8:
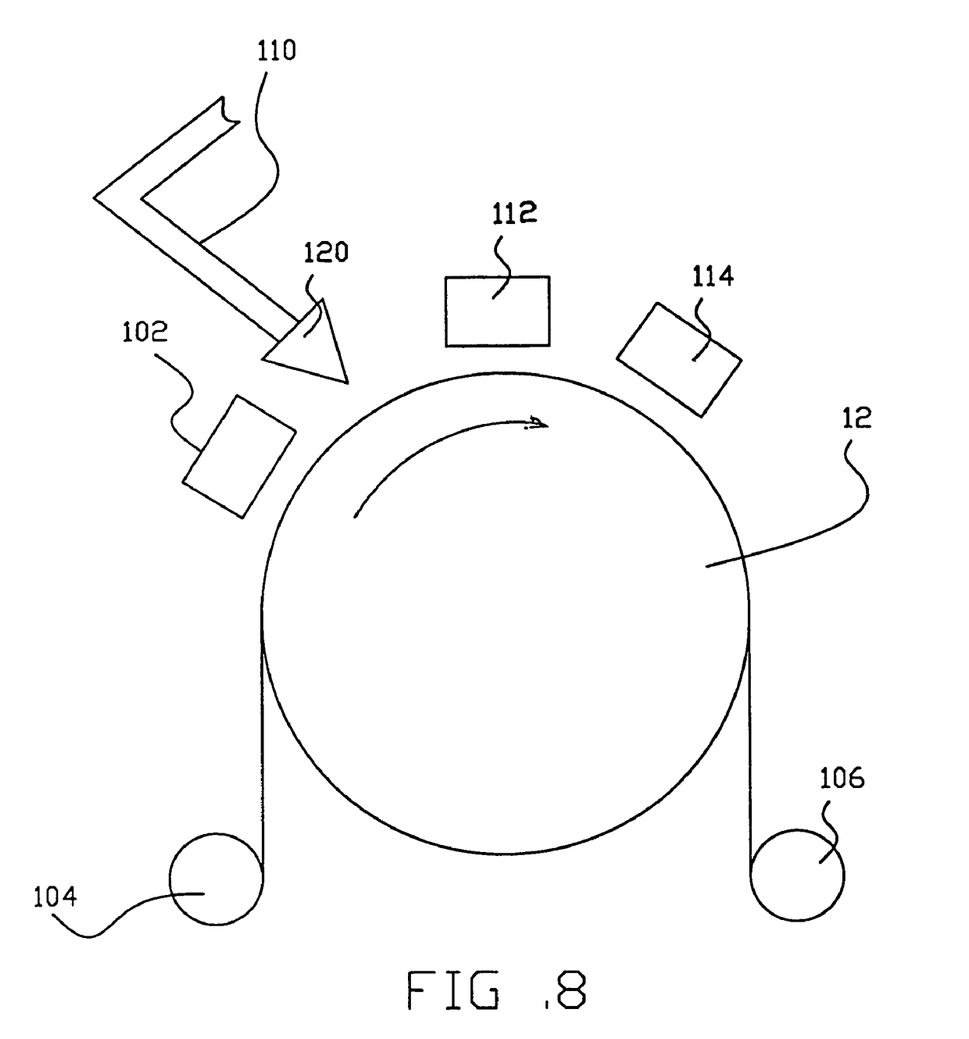
FIG. 8 is a schematic representation of an atmospheric deposition system as illustrated in FIG. 7, wherein the liquid precursor is atomized and deposited by spraying it over the moving substrate.

A similar set of tests was also performed using a liquid atomizer, as illustrated schematically in FIG. 8, rather than an atmospheric vapor deposition system. The results were surprisingly similar to the ones achieved in Examples 1-14. The photoinitiators were mixed and atomized with the liquid precursors and, after deposition, they were cured using the same various treatment steps illustrated above. Examples 15-18 below are typical of the conditions used and the results obtained.

EXAMPLE 15

Atmospheric Plasma Treatment; Atomized Spray Deposition; UV-Light Curing

The conditions were the same as in Example 2, except that the liquid fluoroacrylate monomer was sprayed on the plasma-treated substrate in mist form via an ultrasonic atomizer (Model 03960 by Sono-Tek Corporation of Milton, N.Y.). The resulting coated product exhibited hydrophobic and oleophobic properties with excellent adhesion to the substrate, essentially the same as the results obtained in Example 2.

EXAMPLE 16

Atmospheric Plasma Treatment; Atomized Spray Deposition; Visible-Light Curing; Plasma Post-Treatment The conditions were the same as in Example 3, except that the liquid fluoroacrylate monomer was sprayed on the plasma-treated substrate in mist form via the same ultrasonic atomizer of Example 15. The resulting coated product exhibited comparable hydrophobic, oleophobic, and adhesion properties.

EXAMPLE 17

Atmospheric Plasma Treatment; Atomized Spray Deposition; IR-Light Curing; Plasma Post-Treatment The conditions were the same as in Example 7, except that the liquid fluoroacrylate monomer was sprayed on the plasma-treated substrate in mist form via the same ultrasonic atomizer of Example 15. The resulting coated product exhibited comparable hydrophobic, oleophobic and adhesion properties.

EXAMPLE 18

Atmospheric Plasma Treatment; Atomized Spray Deposition; Electron-Beam Curing; Plasma Post-Treatment The conditions were the same as in Example 11, except that the liquid fluoroacrylate monomer was sprayed on the plasma-treated substrate in mist form via the same ultrasonic atomizer of Example 15. The resulting coated product exhibited comparable hydrophobic, oleophobic and adhesion properties.

Figure 9:
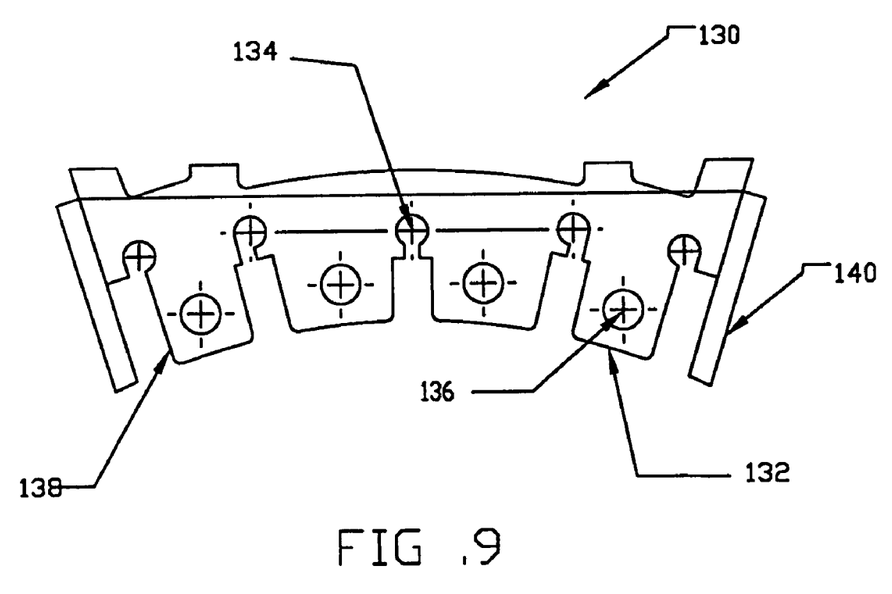
FIG. 9 is a schematic illustration of a water-cooled electrode used to diffuse plasma gas according to the invention.

In some instances, a water cooled electrode, as illustrated in FIG. 9, was used in the production of the plasma field. This enabled the application of greater power to the system. In operation, such an electrode 130 is oriented so that its curved surface 132 faces the process space and the grounded process drum. A plasma gas blanket is established in the plasma region below the curved surface 132 by feeding plasma gas into porous diffusion channels 134. Cooling is established by pumping coolant through cooling channels 136. Dielectric barrier plates 140 are affixed to the outer surface of the electrode to provide containment of the plasma gas at the exterior surface of the electrode assembly. The electrode is electrified with a high voltage source and a partial discharge is generated immediately below the dielectric surface 138. The substrate to be treated is transported in conventional manner through the plasma region on the outer surface of the grounded process drum.

These results show that the invention advantageously enables the production of plasma-enhanced coated substrates at atmospheric-pressure conditions with properties equal to or better than previously obtained under vacuum plasma conditions. The electrodes of the invention can be used for treating and modifying the surface properties of organic as well as inorganic substrates without vacuum equipment or material-thickness limitations. In addition, the results demonstrate that deposited precursors may be cured by alternative means with the appropriate addition of photoinitiators, well understood in the art, in order to tailor the treatment and the application to specific desired results.

Based on their known properties, it is anticipated that a large variety of other polymerizable compounds can be used as precursors for this invention. They include the following:

1. Unsaturated alcohols and esters thereof: allyl, methallyl, 1-choroallyl, 2-chloroallyl, vinyl, methylvinyl, 1-phenalallyl, and butenyl alcohols; and esters of such alcohols with saturated acids such as acetic, propionic, and butyric; with unsaturated acids such as acrylic, α-substituted acrylic (including alkylacrylic, such as methacrylic, ethylacrylic, propylacrylic, etc.; and arylacrylic, such as phenylacrylic), crotonic, oleic, linoeic and linolenic; and with polybasic acids, such as oxalic, and malonic.

2. Unsaturated acids (as listed above for example); and esters thereof with lower saturated alcohols, such as methyl, ethyl propyl, isopropyl, butyl, isobutyl, sec-butyl, tert-butyl, 2-ethylhexyl, and cyclohexyl alcohols; and with saturated lower polyhydric alcohols, such as ethylene glycol, propylene glycol, tetramethylene glycol, neopentyl glycol, and trimethylopropane.

3. Unsaturated lower polyhydric alcohols, such as butenediol; and esters thereof with saturated and unsaturated aliphatic and aromatic, monobasic and polybasic acids, such as illustrated above.

4. Esters of the above-described unsaturated acids, especially acrylic and methacrylic acids, with higher molecular-weight monohydroxy and polyhydroxy materials, such as decyl alcohol, isodecyl alcohol, oleyl alcohol, and stearyl alcohol.

5. Vinyl cyclic compounds including styrene, o-, m-, p-chlorostyrenes, bromostyrenes, fluorostyrens, methylstyrenes, ethylstyrenes, cyanostyrenes; di-, tri-, and tetrachlorostyrenes, bromostyrenes, fluorostyrenes, methylstyrenes, ethylstyrenes, cyanostyrenes, vinylnaphthalene, vinylcyclohexane, divinylbenzene, trivinylbenzene; allybenzene, and heterocycles such as vinyl furan, vinnylpridine, vinylbenzofuran, N-vinylcarbazole, N-vinylpyrrolidone, and N-vinyloxazolidone.

6. Unsaturated ethers, such as methyl vinyl ether, ethyl vinyl ether, cyclohexyl vinyl ether, octyl vinyl ether, diallyl ether, ethyl methallyl ether, and allyl ethyl ether.

7. Unsaturated ketones, such as methyl vinyl ketone and ethyl vinyl ketone.

8. Unsaturated amides, such as acrylamide, methacrylamide, N-methylacrylamide, N-phenylolacrylamide, N-allylacrylamide, N-methylolacrylamide, N-allylcaprolactam, diacetone acrylamide, and 2-acrylamido-2-methylpropane-sulfonic acid.

9. Unsaturated aliphatic hydrocarbons, such as ethylene, acetylene, propylene, butanes, butadiene, isoprene, and 2-chlorobutadiene.

10. Unsaturated alky halides, such as vinyl fluoride, vinyl chloride, vinyl bromide, nylidene bromide, allyl chloride, and ally bromide.

11. Unsaturated acid anhydrides, such as maleic, citraconic, itaconic, cis-4-cyclohexene-1,2-dicarboxylic, and bicyclo(2.2.1)-5-heptene-2,3-dicarboxylic anhydrides.

12. Unsaturated acid halides, such as cinnamyl acrykyl, methacrylyl, crontonyl, oleyl, and fumaryl chlorides or bromides.

13. Unsaturated nitrites, such as acrylonitriles, methacrylonitrile, and other substituted acrylonitriles.

Various changes in the details, steps and components that have been described may be made by those skilled in the art within the principles and scope of the invention herein illustrated and defined in the appended claims. Therefore, while the present invention has been shown and described herein in what is believed to be the most practical and preferred embodiments, it is recognized that departures can be made therefrom within the scope of the invention, which is not to be limited to the details disclosed herein but is to be accorded the full scope of the claims so as to embrace any and all equivalent processes and products.

We claim:

1. A method for manufacturing a coated substrate by an in-line process of plasma treatment and precursor deposition at substantially atmospheric pressure, comprising the following steps:

providing a first electrode and a second electrode separated by a dielectric material and facing a process space:

applying a voltage across the electrodes;

diffusing a plasma gas into the process space at substantially atmospheric pressure to pre-treat the substrate;

depositing a precursor over said substrate, and curing the precursor to produce a polymeric film.

2. The method of claim 1, wherein said curing step is carried out with ultraviolet radiation.

3. The method of claim 1, wherein said curing step is carried out with visible light.

4. The method of claim 1, wherein said curing step is carried out with infrared radiation.

5. The method of claim 1, wherein said curing step is carried out electron-beam radiation.

6. The method of claim 1, wherein said depositing step is carried out by vaporizing and injecting said precursor over the substrate in line with the plasma gas.

7. The method of claim 1, wherein said depositing step is carried out by vaporizing and injecting said precursor over the substrate in line past the process space.

8. The method of claim 1, wherein said depositing step is carried out by atomizing and spraying said precursor over the substrate in line past the process space.

9. The method of claim 7, wherein said curing step is carried out with ultraviolet radiation.

10. The method of claim 7, wherein said curing step is carried out with visible light.

11. The method of claim 7, wherein said curing step is carried out with infrared radiation.

12. The method of claim 7, wherein said curing step is carried out electron-beam radiation.

13. The method of claim 8, wherein said curing step is carried out with ultraviolet radiation.

14. The method of claim 8, wherein said curing step is carried out with visible light.

15. The method of claim 8, wherein said curing step is carried out with infrared radiation.

16. The method of claim 8, wherein said curing step is carried out electron-beam radiation.

17. The method of claim 1, further including the step of post-treating the polymeric film in a plasma field after the step of curing the precursor.

18. The method of claim 6, further including the step of post-treating the polymeric film in a plasma field after the step of curing the precursor.

19. The method of claim 7, further including the step of post-treating the polymeric film in a plasma field after the step of curing the precursor.

20. The method of claim 8, further including the step of post-treating the polymeric film in a plasma field after the step of curing the precursor.

21. The method of claim 9, further including the step of post-treating the polymeric film in a plasma field after the step of curing the precursor.

22. The method of claim 10, further including the step of post-treating the polymeric film in a plasma field after the step of curing the precursor.

23. The method of claim 11, further including the step of post-treating the polymeric film in a plasma field after the step of curing the precursor.

24. The method of claim 12, further including the step of post-treating the polymeric film in a plasma field after the step of curing the precursor.

25. The method of claim 13, further including the step of post-treating the polymeric film in a plasma field after the step of curing the precursor.

26. The method of claim 14, further including the step of post-treating the polymeric film in a plasma field after the step of curing the precursor.

27. The method of claim 15, further including the step of post-treating the polymeric film in a plasma field after the step of curing the precursor.

28. The method of claim 16, further including the step of post-treating the polymeric film in a plasma field after the step of curing the precursor.

* * * * *